United States Patent
Ter Schiphorst et al.

(10) Patent No.: US 12,107,181 B2
(45) Date of Patent: Oct. 1, 2024

(54) LUMINESCENT OPTICAL DEVICE AND A FILM FOR USE WITH SUCH A LUMINESCENT OPTICAL DEVICE

(71) Applicant: TECHNISCHE UNIVERSITEIT EINDHOVEN, Eindhoven (NL)

(72) Inventors: Jeroen Ter Schiphorst, Hedel (NL); Teunis Jort Lowijs Wagenaar, Duivendrecht (NL); Michael George Debije, Eindhoven (NL)

(73) Assignee: CLEARVUE EUROPE HOLDING B.V., Amsterdam (NL)

( * ) Notice: Subject to any disclaimer, the term of this patent is extended or adjusted under 35 U.S.C. 154(b) by 421 days.

(21) Appl. No.: 17/442,477

(22) PCT Filed: Mar. 19, 2020

(86) PCT No.: PCT/NL2020/050185
§ 371 (c)(1),
(2) Date: Sep. 23, 2021

(87) PCT Pub. No.: WO2020/197384
PCT Pub. Date: Oct. 1, 2020

(65) Prior Publication Data
US 2022/0158016 A1 May 19, 2022

(30) Foreign Application Priority Data

Mar. 25, 2019 (NL) ...................................... 2022806

(51) Int. Cl.
G09F 27/00 (2006.01)
H01L 31/055 (2014.01)
G09F 13/22 (2006.01)

(52) U.S. Cl.
CPC .......... *H01L 31/055* (2013.01); *G09F 27/005* (2013.01); *G09F 27/007* (2013.01); *G09F 2013/222* (2013.01)

(58) Field of Classification Search
CPC ............. G09F 2013/222; G09F 27/005; G09F 27/007; H01L 31/0547; H01L 31/055
See application file for complete search history.

(56) References Cited

U.S. PATENT DOCUMENTS

2009/0100727 A1  4/2009  Chen
2012/0118381 A1*  5/2012  Debije ................. G02B 6/0058
                                                      362/621
(Continued)

FOREIGN PATENT DOCUMENTS

DE    202010001155 U1   4/2010
JP       2008516264 A   5/2008
(Continued)

OTHER PUBLICATIONS

International Search Report and Written Opinion mailed May 27, 2020 for PCT/NL2020/050185.
(Continued)

*Primary Examiner* — Dani Fox
(74) *Attorney, Agent, or Firm* — Suiter Swantz IP

(57) ABSTRACT

A luminescent optical device based on a luminescent solar collector, LSC, is disclosed. In addition to components forming a LSC for generating electrical energy from solar energy, the luminescent optical device also includes a light source, and optionally one or more sensors, both electrically connected to an energy storage device of the LSC. Under the control of a control unit, the light source may emit light of different wavelengths, for example in response to environmental data measured by the sensor, thereby exciting respective domains containing luminescence material to emit light of different colours. The luminescent optical device may (Continued)

function as a standalone and fully integrated device that is capable of harvesting energy, illuminating itself and displaying various content conveniently and flexibly, for various purposes.

17 Claims, 3 Drawing Sheets

(56) References Cited

U.S. PATENT DOCUMENTS

| | | |
|---|---|---|
| 2013/0133736 A1 | 5/2013 | Van Bommel et al. |
| 2013/0272023 A1 | 10/2013 | Lai |

FOREIGN PATENT DOCUMENTS

| | | |
|---|---|---|
| JP | 2013501353 A | 1/2013 |
| JP | 2015515086 A | 5/2015 |
| JP | 2016165460 A | 9/2016 |
| WO | 2015194431 A1 | 12/2015 |

OTHER PUBLICATIONS

European Communication dated Apr. 4, 2023; European Application No. 20714715.8.

* cited by examiner

LUMINESCENT OPTICAL DEVICE AND A FILM FOR USE WITH SUCH A LUMINESCENT OPTICAL DEVICE

TECHNICAL FIELD

The present disclosure generally relates to optical devices, in particular to a luminescent optical device using photo-luminescence, and a film for use with such a luminescent optical device.

BACKGROUND

Emission of light by a substance not caused by heat is generally referred to as luminescence. One form of luminescence, referred to as photo-luminescence, PL, and generally classified into fluorescence and phosphorescence, results from absorption of energy by a substance subjected to electromagnetic radiation, which energy is released in the form of emitted electromagnetic radiation. In most cases, the emitted electromagnetic radiation has a longer wavelength than the absorbed electromagnetic radiation.

A luminescent solar concentrator, LSC, is a device that makes use of photo-luminescence material and solar cells for generating electrical energy.

An LSC operates by collecting electromagnetic radiation or light emitted by the photo-luminescence material over a relatively large surface area, and by directing the emitted radiation into a relatively small solar cell target, Photo-Voltaic, PVs, cells, for example.

As an example, an LSC may be constructed by applying a highly fluorescent ink coating on a surface of a transparent carrier made of a material having a relatively high refractive index, such as plastic or glass. Electromagnetic radiation, in particular sunlight or ambient light, incident at the LSC, is absorbed by the fluorescent material, and electromagnetic radiation or light emitted by the fluorescent material is coupled into the transparent carrier. Due to the high refractive index of the carrier material, a larger part of the emitted light is trapped in the carrier by total internal reflection. A fraction of the light emitted outside an efficient angle, also referred to as the critical angle, will leave the LSC as fluorescence light. The part of the emitted light that is trapped in the transparent carrier travels to the side(s) thereof, where photo-voltaic cells are optically coupled to an edge or edges of the transparent carrier. The photo-voltaic cells convert part of the emitted light into electrical energy, for charging an energy storage device, such as a battery.

Electricity generated by an LSC and stored in an energy storage device may be used for various purposes. US 2012/0118381 A1, which is herein incorporated by reference, discloses an LSC comprising a light source optically coupled to an edge of the transparent carrier for illuminating an image formed by a pattern of luminescence material applied at a surface of the transparent carrier or applied at a film arranged on a surface of the transparent carrier. The light source is powered from the energy storage device.

The pattern may comprise different luminescence materials emitting light of different colours when illuminated by the light source for displaying a coloured single image by the LSC.

In practice, there is a need for a more versatile operation of an LSC, for selectively displaying different images from a pattern of luminescence materials.

SUMMARY

The above-mentioned object is solved, in a first aspect of the present disclosure, by a luminescent optical device comprising a carrier panel arranged for guiding light; at least one photo-voltaic cell optically coupled to the carrier panel and arranged for generating electrical energy from light received from the carrier panel; an energy storage device electrically connected to the at least one photo-voltaic cell and arranged for storing electrical energy generated by the photo-voltaic cell; a light source optically coupled to the carrier panel, electrically connected to the energy storage device, and arranged for emitting light into the carrier panel. A plurality of luminescent domains are provided at the carrier panel and arranged for emitting luminescent light into the carrier panel upon excitation by ambient light, and for externally emitting visible luminescent light upon excitation by light from the light source guided via the carrier panel. Different luminescent domains of the plurality of luminescent domains are comprised of luminescence material arranged for emitting visible luminescent light upon excitation by light of different wavelengths, and the light source is arranged for emitting light of different wavelengths for exciting respective domains to emit luminescent light.

The present disclosure is based on the insight that the emission of luminescent light by a particular luminescence material, i.e. a photo-luminescence material, depends on the wavelength of electromagnetic radiation, i.e. the wavelength of light incident upon the respective luminescence material. By constructing a pattern of luminescent domains of luminescence material that emit visible luminescent light representing different images upon excitation by light of a particular wavelength, or a particular range of wavelengths, different images may be displayed by selectively illuminating the respective domains corresponding to a particular image by controlling the wavelength or wavelengths of the light emitted by the light source.

Hence, with the luminescent optical device according to the present disclosure, different images can be displayed from a pattern of luminescent domains by a proper selection of the composition of the light emitted by the light source. It will be appreciated that the domains of different luminescence material may be selected and arranged in groups to display different images and/or to display a same image in different colours, for example. The term image is to be construed in its most general form, including pictures, icons, diagrams, signs, pictograms but also textual content such as characters, figures, marks or any other type of graphics or information or content.

With the configuration as described above, the electrical energy generated and stored by the luminescent optical device is used to power the light source without the need of an external power source and/or external connection cables. The luminescent optical device according to the present disclosure can therefore function as a stand-alone and fully integrated device that is capable of harvesting energy, illuminating itself and displaying various content conveniently and flexibly, for various purposes. For example, the luminescent optical device allows for colourful designed windows, wall elements, advertisement panels, signage and other construction materials to be provided.

Moreover, the realisation of multiple colour radiation allows complex patterning of images of various colours and possibly different brightness to be displayed. The resultant products may therefore be rendered with artistic and aesthetic effects, such as colour depth for providing 3D effects.

The light source and the plurality of luminescent domains of luminescence material may also be combined to generate more dynamic effects, such as making the displayed content glow The selective enablement of dynamic effects further enhances the application of the luminescent optical device, for example for warning or notification purposes.

The luminescent optical device may also be advantageously arranged to change its display in response to or in connection with changes in the surroundings of the device. For this purpose, the luminescent optical device may further comprise one or more sensors for collecting information or measurement data with regard to the surroundings. The integration or connection of the luminescent optical device with its surroundings is beneficial as it allows the luminescent optical device to operate in a responsive manner.

Still another advantage of the present luminescent optical device is that the different luminescence materials of the domains effectively improve the operational range of the device for converting ambient light into electric energy, as a greater part of the ambient light, i.e. various wavelengths, may be absorbed by the different materials.

In accordance with an embodiment of the present disclosure, the light source may comprise one or more controllable, such as programmably controllable light emitting diodes, LEDs. Specifically, the device may comprise a plurality of different single-colour LEDs, or using multicolour LEDs to illuminate light of specific colours, i.e. wavelengths, for exciting respective ones of the domains of different luminescence material corresponding to a particular image to be displayed.

The LEDs may be positioned at one or several positions of the transparent carrier panel, for example at opposite sides or edges of a rectangular carrier panel, to provide a homogeneous illumination of the domains of luminescence material.

Alternatively, the light source may comprise a light diffusing optical fibre connected to a laser light source capable of emitting light of different wavelengths or wavelength ranges. The light diffusing optical fibre may be arranged for completely surrounding the carrier panel, for example completely surrounding the sides or edges of a rectangular carrier panel, for providing as even as possible homogeneous illumination of the carrier panel, without or negligibly affecting the amount of luminescent light coupled into photo-voltaic cells positioned at one or more sides or edges of the carrier panel. In this sense, any available edge of the carrier panel may be used for illumination without affecting the energy generation.

For operating the luminescent optical device in connection with its surrounding environment, in accordance with an embodiment of the present disclosure, the device may further comprise at least one sensor for monitoring or detecting parameters or measurements of the surrounding. The sensor or sensors may be powered by the electric energy generated by the photo-voltaic cell or cells of the luminescent optical device and stored in the energy storage device thereof. The image to be displayed, i.e. the wavelength of the light produced by the light source, may change depending on measured data of the sensors. The luminescent optical device may be arranged for connecting a sensor or sensors in a plug-and-play mode, which allows the device to selectively monitor one or more aspects of the environment, as necessary.

In particular, the at least one sensor may comprise one or more of a motion sensor, an optical sensor, a temperature sensor, a humidity sensor, a particle sensor, an Infrared, IR, sensor, a radiation sensor, and a $CO_x$ sensor, operatively connected to the light source. The light source thereby may emit light of different wavelengths in response to different readings or measured data from the at least one sensor.

As an example, with a motion sensor and a light sensor, one may decide to switch on the display of an image by the optical device during night time, as perceived from light sensor readings, and only when required to inform a person moving in the vicinity of the device low, as detected from motion sensor readings, for saving energy stored in the energy storage device, for example.

As another example, sensors relating to environmental quality, such as light sensors, temperature sensors and the like may be used to control an action, such as opening a window, switching glazing for windows, etc.

In accordance with an embodiment of the present disclosure, the luminescent optical device may further comprise a separate control unit for controlling the light provided by the light source. The control unit is electrically connected to the light source and the at least one sensor, and is powered from the energy storage device, and is arranged for controlling the light source to emit light of different wavelengths.

The incorporation of the control unit, in particular a processor controlled control unit, makes it possible to programmably control the display effects of the luminescent device by selectively emitting light, i.e. electromagnetic radiation, of a respect wavelength or range of wavelengths for displaying a respective image or image effect. The control unit may switch between different (predefined) modes, which are customised as needed, allowing the light source to emit light of different wavelengths in a more diversified manner, thereby enabling a customised and flexible display of (predefined) images and effects adapted to particular application areas.

The plurality of luminescent domains may comprise domains of luminescence material that differs from each other in terms of at least one of thickness, concentration and composition. By varying the concentration and/or thickness of the luminescence material in a respective domain, it is possible to change the intensity of the emitted luminescent light. It is also possible to have a gradient in concentration or thickness in between different domains such that an even more versatile displaying effect can be realised.

In an advantageous disclosure, the plurality of luminescent domains comprise domains varying in a descending gradient manner from a peripheral part to a central part of the carrier panel. That is, domains located closer to edges of the carrier panel, where the PV cells are arranged, are provided with luminescent material of higher coverage percentage, thickness and/or concentration, such that luminescent light emitted by these domains can reach the PV cells over a relatively short distance. This, among others, with less losses caused by re-absorption of emitted luminescent light by other domains located at the carrier panel. Such arrangement of domains near edges of the carrier panel beneficially increases power output of the luminescent optical device.

A variation in different illuminating colours relies substantially on a variation of the composition of a domain using of luminescence materials which respond to different excitation wavelengths. An even more colourful display effect is provided by mixing different material compositions in a same domain, for example.

Overall, the arrangement of different luminescent domains in clusters or in a matrix or array form is beneficial to provide a versatile use of the luminescent optical device for a large range of applications, with different desired image appearance requirements.

As an example, such a matrix or array may include domains of various sizes, including domains of small pixels. Such pixels may have dimensions by which same are essentially not visible to the eyes when excited by ambient light, however will become visible when excited by the light source. Such small pixels may be used, for example, for applications having higher aesthetic requirements.

In accordance with another embodiment of the present disclosure, the plurality of luminescent domains are comprised by a film separately attached to the carrier panel. Having the luminescent domains arranged on a structure separate from the luminescent optical device allows for an even improved flexibility in the use of the optical device. That is, the optical device may be uniformly produced without any particular pattern of luminescent domains. The images to be displayed may then be applied by selecting a particular prefabricated film comprising luminescent domains adapted for a particular application.

Even more, when the carrier panel of the luminescent optical device comprises opposite surfaces, it is possible to attach different films to the opposite surfaces of the luminescent optical device, allowing films with different patterns, colours and content to be placed onto the carrier panel based on different requirements, thereby enhancing the number of images that can be displayed, for example.

It is even more flexible to have the film detachably attached to the carrier panel, in particular, by way of an adhesive optically coupling the film and the carrier panel or, for example, by static electricity. In this way, the images to be displayed may be easily changed by replacing the film from time to time, in a way similar to changing an announcement on an advertisement board.

The film may also be laminated or sandwiched between two carrier panels. Luminescent light emitted by the domains on the film may therefore be used by PV cells arranged at edges of both carrier panels to generate energy. Moreover, patterns formed by the luminescent domains on the film may be protected against damaging or external atmospheric conditions, such as weather conditions, as a result of laminating the film between the carrier panels.

Life time of the pattern formed by the luminescent domains on the film may be enhanced by including Ultraviolet, UV, protecting foils between the film and the carrier panels. Several films and UV protecting foils may be laminated between carrier panels.

It can be contemplated that the plurality of luminescent domains may be provided on the film by at least one of inkjet printing, slot-die-coating, and screen printing. The film is suitable for mass-scale production and may thereby be manufactured at a lower cost.

Having a carrier panel that is mechanically flexible is also advantageous, which will allow the luminescent optical device to be arranged on or as curved structures, which may be rollable and bendable. This further improves the applicability and flexibility of the device.

The luminescent optical device as described above may be arranged for operating at least one of a signage, a Building-Integrated Photo-Voltaic, BIPV, an advertisement panel, a glass for automotive, and an aesthetics article. These products and devices may display content using an integrated light source powered by electrical energy generated by the products and devices themselves.

A second aspect of the present disclosure provides a film comprising a plurality of luminescent domains containing luminescence material for use with the above luminescent optical device, as disclosed above.

Such a film may be arranged into separable sections and provided on a roll. As a result, a piece of film may be easily removed from the roll when needed and attached to the carrier panel.

The above mentioned and other features and advantages of the disclosure will be best understood from the following description referring to the attached drawings. In the drawings, like reference numerals denote identical parts or parts performing an identical or comparable function or operation.

DETAILED DESCRIPTION

The present disclosure is detailed below with reference to a luminescent optical device generally adopting a planar structure. However, it may be appreciated by those skilled in the art that the planar structure is for illustrative purposes only and not limitative to the present disclosure.

In the following description and claims of the present disclosure, the following terms are used.

The term "luminescent" refers to the emission of light by a luminescence material after absorbing energy from electromagnetic radiation, such as light, of sufficient quantum energy. The term includes both fluorescence and phosphorescence.

The term "domains" refers to regions formed independently of each other and including luminescence material of different composition, different thickness or different concentration, for example.

The term "optically coupling" means that light or radiation is mostly transmitted from one part of the luminescent optical device to another part of the luminescent optical device.

Figure 1:
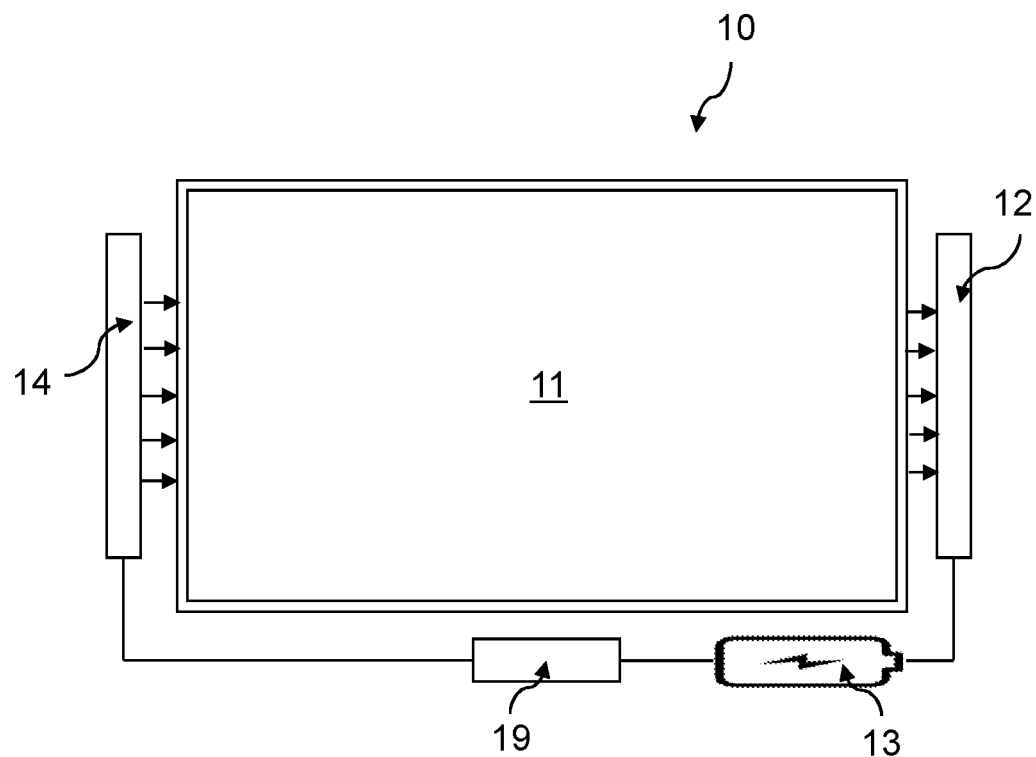
FIG. 1 shows, in a schematic and illustrative manner, an embodiment of a luminescent optical device in accordance with the present disclosure in plan view.

FIG. 1 illustrates, in a schematic and illustrative manner, a top view of an example embodiment of a luminescent optical device 10 in accordance with the present disclosure.

The luminescent optical device 10 comprises a rectangular transparent carrier panel 11 arranged for guiding light, at least one photo-voltaic, PV, cell 12 optically coupled to an edge of the carrier panel 11 and arranged for generating electrical energy from light received from the carrier panel 11. An energy storage device 13 is electrically connects to the at least one PV cell 12 and is arranged for storing electrical energy generated by the at least one photo-voltaic cell 12. The energy storage device 13 is further electrically connected to at least one light source 14, via a control unit 19, in particular a processor controlled control unit. The at least one light source 14 is optically coupled to an edge of the carrier panel 11 and arranged for emitting light into the carrier panel 11. The luminescent optical device also comprises luminescent domains arranged on one or both surfaces of the carrier panel 11, which will be described with reference to FIG. 2.

It will be appreciated that the PV-cells 12 and the light source 14 may optically connect to other sides or more than two sides or even to an upper and/or lower surface of the carrier panel 11, other than illustrated in FIG. 1.

Figure 2:
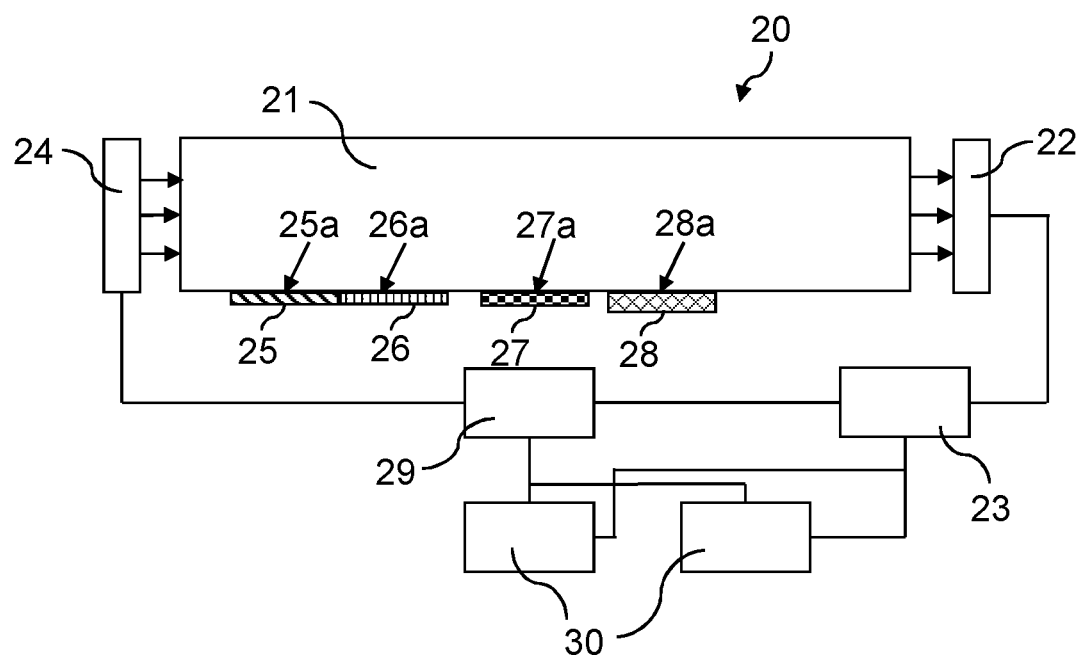
FIG. 2 shows, in a schematic and illustrative manner, an embodiment of a luminescent optical device in accordance with the present disclosure from a side-view.

FIG. 2 illustrates, in a schematic and illustrative manner, an embodiment of a luminescent optical device 20 in accordance with the present disclosure. Similar reference numbers of FIG. 1 and FIG. 2 refer to similar components of the luminescent optical device and will not be described in detail again.

In addition to the components described in FIG. 1, the luminescent optical device 20 comprises a plurality of luminescent domains 25-28 provided at a surface of the carrier panel 21 and arranged for emitting, upon excitation by ambient light, luminescent light into the carrier panel 21, and for externally emitting visible luminescent light, upon excitation by light from the at least one light source 24 guided via the carrier panel 21. The luminescent domains 25-28 may contain different luminescence material 25a-28a that can emit visible light upon excitation by light of different wavelengths emitted from the at least one light source 24.

The luminescent domains 25-28 may comprise a first group of luminescent domains that comprise luminescence material arranged for emitting visible luminescent light upon excitation by light of a first wavelength and at least one further group of luminescent domains that comprise luminescence material arranged for emitting visible luminescent light upon excitation by light of at least one further wavelength. Accordingly, the least one light source 14 may be arranged for selectively emitting light of the first wavelength and the at least one further wavelength for exciting respective groups of the one group and the at least one further group of luminescent domains to emit luminescent light.

The carrier panel 21 may be formed of a light transparent material having a relatively high refractive index, such as plastic or glass, in various shapes, planar, curved, and any other shape suitable for application. In particular, it is advantageous that the carrier panel 21 has a surface with a relatively large area for arranging the luminescent domains 25-28 thereat, such that the luminescent domains 25-28 may sufficiently collect radiation and emit light into the carrier panel 21, allowing the carrier panel 21 to transport the light trapped therein by way of total internal reflection to the at least one photo-voltaic cell 22.

The optical coupling between the carrier panel 21 and the PV cell 22 is provided such that there is an efficient coupling of the collected and guided light radiation from the carrier panel 21 to the PV cell 22. Arranging the PV cell 22 at a relatively small edge of the carrier panel 21 is advantageous and it will require less PV cells and thereby save cost of the luminescent optical device 20.

The energy storage device 23 may be any suitable and known device such as a battery, a capacitor, etc.

The at least one light source 24 may be arranged for coupling light into the carrier panel 21, for example at an edge of the carrier panel 21. The luminescence material 25a-28a included in the luminescent domains 25-28 on the carrier panel 21 absorbs the light from the light source 24 guided by the carrier panel 21, and the absorbed light is emitted as visible light, including visible light of different colours, due to fluorescence for example.

The at least one light source 24 may include any suitable light source that is lightweight and suitable for the purpose of illuminating the luminescent optical device 10, 20. For instance, the light source 24 may comprise one or more light emitting diodes, LEDs, each with a single different colour or able to emit light of different colours upon powering with a respective selected electric current. The emission of light by the LEDs comprising the light source may be programmed as needed, such that light of different wavelengths may be emitted, thereby exciting respective luminescent domains 25-28, such that the luminescent domains 25 may emit visible luminescent light, in particular light in different colours.

That is, the at least one light source 24 may be controlled to emit light of a first wavelength exciting a first domain or a first set of domains, to emit light of a second wavelength, different form the first wavelength, exciting a second domain or a second set of domains, etc. The light source may be further controlled to emit light comprising both the first and second wavelengths for exciting the first and second domains, i.e. the first and second sets of domains simultaneously, for example.

Moreover, for the purpose of achieving the desired illumination effects, the LEDs may be arranged at different positions of the carrier panel 20. For example, the positions of the LEDs may correspond to the arrangement of the luminescent domains 25-28 at the carrier panel 21, thereby exciting the different luminescence material included in the luminescent domains 25-28 with light of a respective wavelength. As another example, the LEDs may be arranged in a frame of the luminescent optical device, such as at opposite sides or edges of the carrier panel 21, thereby illuminating the luminescent domains on the carrier panel 21 in a homogeneous manner.

In selecting the luminescence material, one may also take energy consumption into consideration by, for example, selecting luminescence material by wavelengths that can be emitted by the LEDs against minimal energy consumption.

Figure 3:
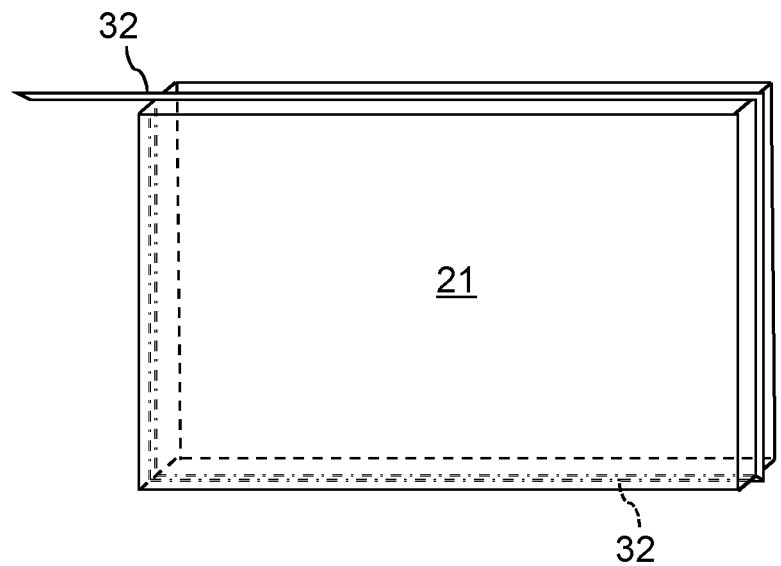
FIG. 3 illustrates, in a perspective view, a light source comprising a light diffusing optical fibre wound around edges of a luminescent optical device.

Alternatively, as illustrated in FIG. 3, the light source 24 may comprise a light diffusing optical fibre 32 surrounding an edges or edges of the carrier panel 21. The arrangement of the light diffusing optical fibre 32 will not or will only negligibly affect the amount of luminescent light coupled into PV cells positioned at one or more sides or edges of the carrier panel 21, among others due to its relative thin diameter. The optical fibre 32 arranged in this way and powered from a laser device (not shown) provides a more homogeneous illumination to the carrier panels. The use of an optical fibre 32 also enhances the applicability of the whole luminescent optical device 20, due to feature that the light diffusing optical fibre is bendable such to encompass different shapes of carrier panel other than rectangular. The PV cells may, for example, be optically coupled to the carrier at a position opposite of the optical fibre 32.

In order to control the lighting of the LEDs or the light diffusing optical fibre 32, the luminescent optical device 20 may further comprise a control unit 29 that is electrically connected to the light source 24, i.e. the LEDs or the laser device of the light diffusing optical fibre 32.

The incorporation of the control unit 29 makes it possible to control the display effects of the whole luminescent device 20 more easily, i.e. flexible and selectively. For example, the control unit 29 may switch between different modes, which are customised or pre-configured as needed, allowing the light source 24 to emit lights of different wavelengths in a more diversified manner, thereby enabling customised and more flexible display effects and applications, for example.

The control of the light source 24 to emit of light of different wavelengths using the control unit 29 may be performed in connection with a change in the surroundings or ambient of the luminescent device, which will be detailed further in the description.

The luminescence material 25a-28a contained in the plurality of luminescent domains 25-28 may be highly fluorescent inks including but not limited to organic fluorescent dyes, quantum dots and phosphors. The luminescent material may be commercially available, which benefits economical production of the device.

The luminescent domains 25-28 may differ from each other in terms of concentration, thickness or composition of the luminescence material 25a-28a included in the luminescent domains 25-28. Varying the concentration and/or thickness of the luminescence material 25a-28a in the respective luminescent domains 25-28 makes it is possible to change intensity of the emitted visible luminescent light, for example. Changing the concentration of the luminescence material 25a-28a also allows higher efficiency in generating electricity, for example. At the same time, a variation of the compositions of the luminescence material 25a-28a allows the corresponding luminescent domains 25-28 to respond to different excitation wavelengths, thereby emitting visible light selectively, including light of different colours.

As an example, luminescent domains 25-28 may be arranged such that there is a "fade out" of luminescent material 25a-28a towards a centre of the carrier panel 21. Fading out here refers to allowing luminescent domains 25-28 located closer to edges of the carrier panel 21, where the PV cells are arranged, to have luminescent material 25a-28a of higher coverage percentage, thickness and/or concentration, compared to luminescent domains 25-28 located at the central part of the carrier panel 21, for example.

As a result, luminescent light emitted by the domains 25-28 closer to the edges of the carrier panel 21 can reach the PV cells 22 more easily as the light travels shorter distances, reducing losses caused by out-coupling of the luminescent light from the carrier panel 21 into the PV cells 22 and re-absorption by luminescent material 25a-28a. Such structure of the domains beneficially increases power output of the luminescent optical device.

The luminescent domains 25-28 may be arranged in clusters or in a matrix or array form. As an example, a matrix or array may include luminescent domains of various sizes, including domains of small pixels. Such pixels are essentially not visible to the human eyes when excited by ambient light incident upon a pixel, however will become visible when excited by light from the light source. Such small pixels may be used for applications having higher aesthetic requirements or the like.

The luminescent domains 25-28 may be arranged as being separate from each other, or next to each other, based on the purpose of display and the content to be displayed. In the case that two luminescent domains 25-28 are arranged next to each other, a boundary between the two domains 25-28 may adopt any shape suitable for rendering the desired display effect. Complex images may therefore be generated by using a plurality of luminescent domains 25-28.

The luminescent optical device 20 as described above can function as a stand-alone and fully integrated device that is capable of harvesting energy, generating electrical energy from the harvested energy, illuminating itself using the generated electrical energy and displaying various content conveniently and flexibly, for various purposes. There is no need for an external power source or external connection cables, making the device itself self-contained and flexible to use.

Figure 4:
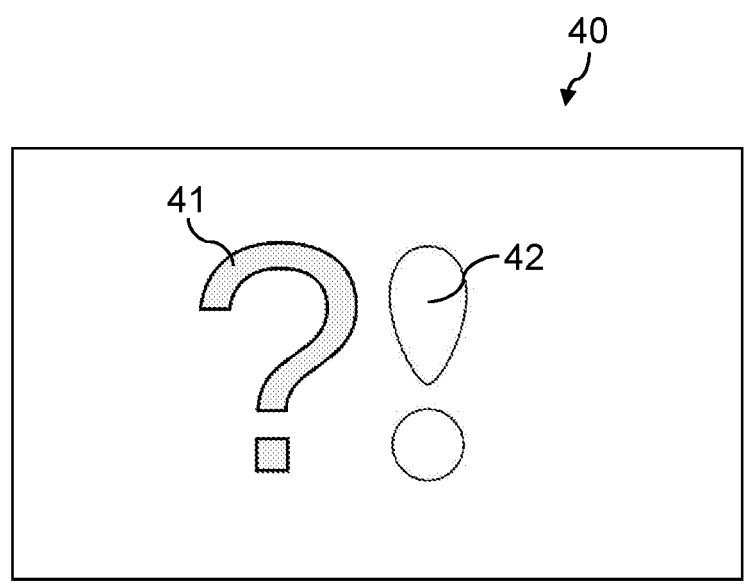
FIGS. 4 and 5 illustrate examples of different images displayed using a luminescent optical device in accordance with the present disclosure.

It is possible that different images may be displayed, with the same pattern formed by different luminescent domain 25-28. FIG. 4 schematically shows luminescent optical device 40 having a pattern including luminescent domains 41, 42. Luminescent domain 41 includes luminescence material that emits light of a first colour, say yellow, in response to a first wavelength, and luminescent domain 42 includes luminescence material that emits light of a second colour, say red, in response to a second wavelength. Therefore, by controlling the light source 24 to respectively emit light of the first or the second wavelengths, the luminescent optical device 40 may display a first image with a question mark, or a second image with an exclamation mark. Those skilled in the art will appreciate that the domains 41 and 42 may be selected to emit light of a same colour, for example, upon excitation by light of different wavelength.

Figure 5:
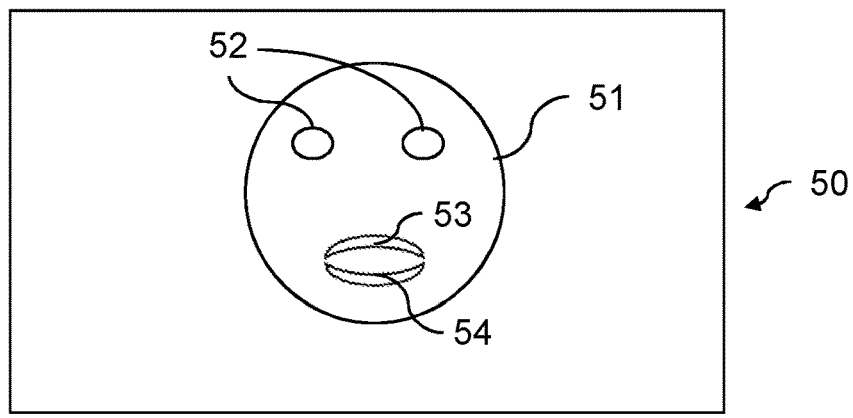

As another example, FIG. 5 schematically shows a luminescent optical device 50 having a pattern including luminescent domains 51, 52, 53 and 54. It is designed that the luminescent domains 53 and 54 respond to different wavelengths, such that when different excitation wavelengths are used respectively, the luminescent optical device 50 may be made to display a smiling face or a sad face, for example.

Referring back to FIG. 2, for the purpose of controlling the lighting of the light source 24, that is, emission of light of different wavelengths by the lighting source 24, the luminescent optical device 20 may advantageously further include one or more sensors 30. The sensors are electrically connected to the energy storage device 23 such that they may be powered by the electrical energy generated by the luminescent optical device 20 conveniently, without the need for an external power source. Moreover, the sensors 30 are also electrically connected to the control unit 29.

The luminescent optical device 20 may be designed to comprise the sensors 30 in a plug-and-play mode, for example. Sensors 30 may also be replaced as necessary.

By including a feedback-loop, data measured or read by the sensors may be used to change the illumination of the light source 24, allowing a visual rendering of the displayed image dependent on measured values. Change of the illumination of the light source 24 may correspond to, for instance, but not limited to, a change in colour, or increasing/decreasing brightness of the displayed content.

The sensors 30 may comprise one or more of a motion sensor, an optical sensor, a temperature sensor, a humidity sensor, a particle sensor, an Infrared, IR, sensor, a radiation sensor, and a $CO_x$ sensor.

Under the control of the control unit 29, and in response to different readings or measured data from the at least one sensor 30, the light source 24 may emit light of different wavelengths.

As an example, in the case that the luminescent optical device 20 is used as an advertisement panel and the sensor 30 is an optical sensor, the light source 24 may be controlled, by the control unit 29, to switch on when a strength of the ambient light falls under a threshold, that is, when night comes.

Data measured by the sensors 30 may also be used to perform other control operations. As another example, in the case that the luminescent optical device 20 is used as window glass, and the sensor 30 includes a temperature sensor, the control unit 29 may be used to control an actuator that closes the window when the air temperature falls under a threshold.

The inclusion of the sensors 30 significantly enhances the applicability of the luminescent optical device 20, allowing the luminescent optical device 20 to be used for all kinds of circumstances and purposes. For example, the luminescent optical device 20 as described above may be arranged for operating at least one of a signage, a Building-Integrated Photo-Voltaic, BIPV, an advertisement panel, a glass for automotive, an aesthetics article and other.

Those skilled in the art will appreciate that the luminescent optical device 20 may communicate in a data network or with a processing device, for example, using any currently available transmission technology, such as Wi-Fi or Bluetooth and the like.

It will be appreciated by those skilled in the art that a power cord may be optionally provided, such that power may be delivered from the PV cells or the energy storage device back to a power grid, if applicable using an AC-DC converter. This is especially advantageous for luminescent optical devices operating as BIPV.

Figure 6:
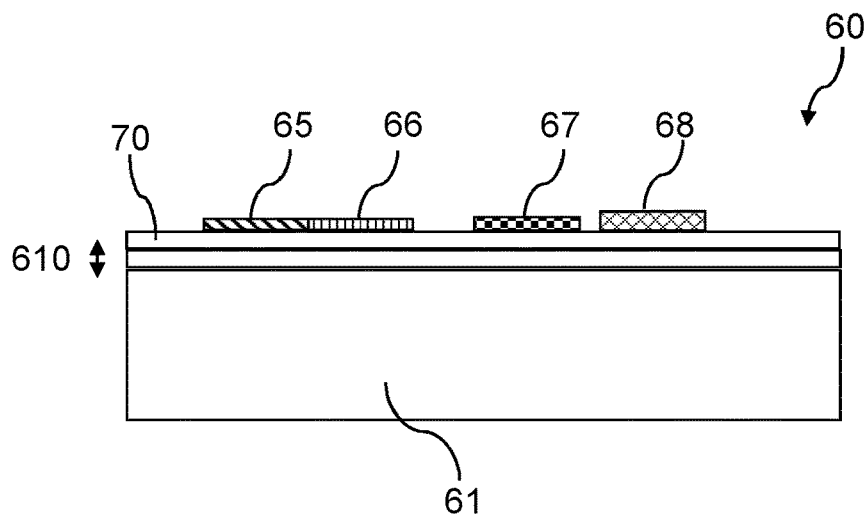
FIG. 6 shows, in a schematic and illustrative manner, an embodiment of a luminescent optical device having luminescent domains comprised with a film attached to a carrier panel.

With reference to FIG. 6, which illustrates, in a schematic cross section view, a luminescent optical device 60 including luminescent domains 65-68 comprised in a film or a foil 70, which is, optionally in a removable manner, attached 610 to a carrier panel 61 of the luminescent optical device 60. Other components of the luminescent optical device 60 are not illustrated for convenient purpose.

As an example, the film or foil 70 comprising the luminescent domains 66-68 may be attached to the carrier panel 61 by way of adhesive optically coupling, such as a transparent glue or tape. The attachment between the film or foil 70 and the carrier panel 61 may also be realised via static electricity.

Having a separable and removable film 70, including the luminescent domains 65-68, which is the essential part for displaying a desired image, allows the film to be changed as necessary, accordingly changing the display pattern or image, based on different requirements. This in a way is similar to changing advertisement board from time to time.

For a carrier panel 61 with two opposite surfaces that are both exposed to a viewer, it is also possible to attach the film or foil 28 to both surfaces. This allows more flexibility with the usage of the luminescent optical device 60.

Figure 7:
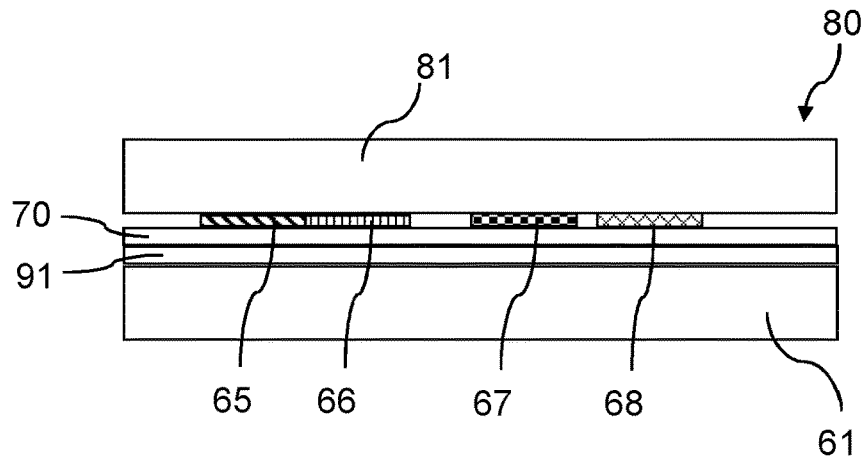
FIG. 7 shows, in a schematic and illustrative manner, an embodiment of a luminescent optical device having luminescent domains comprised with a film laminated between two carrier panels.

In another embodiment as illustrated in FIG. 7, a film 70 comprising luminescent domains is laminated between a carrier panel 61 and a further carrier panel 81. With this design, luminescent light emitted by the luminescent domains on the film 70 may be used by PV cells (not shown) arranged at edges of both carrier panels 61, 81 to generate energy. Moreover, patterns formed by the luminescent domains on the film 71 may be protected as a result of laminating the film between the carrier panel 61, 81.

Life time of the pattern formed by the luminescent domains on the film 70 may be enhanced by including one or more UV protecting foils 91 between the film 70 and the carrier panels 61, 81, with both the film and the UV protecting foils laminated between the carrier panels 61, 81.

It will be appreciated by those skilled in the art that foils for other functional properties, such as for IR reflection or acoustic insulation, may be stacked on the film 70 and laminated between the carrier panels 61, 81 when considered appropriate.

The plurality of luminescent domains 65-68 may be provided on the film or foil 70 by a deposition technique, including, but not limited to, inkjet printing slot-die-coating, and screen printing. As a result, multi-colour parts may be generated by depositing multiple colour coatings, resulting in a desired image.

Images or content to be displayed formed by using the luminescent domains 65-68 including the luminescence material may be formed permanently or non-permanently by deposition of the ink on the removable film or foil 70, allowing reuse of electronic components, such as sensors 30 and the control unit 29, while still being able to use all above described features and changing the image depicted on the luminescent optical device.

To further enhance the flexibility of the luminescent optical device, the carrier panel may be mechanically flexible, which will allow the luminescent optical device to be arranged on or as curved structures.

It is also advantageous to arrange the removable film 70 into separable sections and have it provided on a roll. As a result, a piece of film 70 may be easily removed from the roll when needed and attached to the carrier panel 61.

For a luminescent optical device including a film with printed patterns, the print thickness is usually in a range of about 1 micrometer to about 50 micrometers. Depending on the specific application, the carrier panel may have a thickness in a range of several millimetres to several centimetres.

As an example, for window glazing applications, carrier panels may have a thickness between 5 mm up to 2 cm.

For a triple glazing structure, there may be a stack of 4 mm glass panel, a layer of argon of 8 mm to 12 mm, another 4 mm glass panel, another layer of argon of several millimetres, and again 4 mm glass panel, resulting in a total stack thickness between 28-36 mm. For double glazing it is often 24 mm.

Depending on the material used for the film or foil, the film may have a thickness form micron range up to mm range. For example, a Polyethylene terephthalate, PET, film or foil, used as a functional layer in a stack, is often in the micron range, while Polyvinyl alcohol, PVA, and/or Polyvinyl butyral, PVB, adhesive layers often are 0.1-0.8 mm.

Size of a square carrier panel, for example, can be anything from a couple of cm up to several meters, depending on the application. As an example, for building windows and billboards, the carrier panel can easily be up to several hundred millimetres in both width and length.

The at least one light source may also be powered from an external power source, in which cast the at least one PV cell and the storage device may be omitted.

The present disclosure is not limited to the examples as disclosed above, and can be modified and enhanced by those skilled in the art beyond the scope of the present disclosure as disclosed in the appended claims without having to apply inventive skills.

The invention claimed is:

1. A luminescent optical device, comprising:
    a carrier panel configured for guiding light;
    at least one photo-voltaic cell, optically coupled to the carrier panel and configured for generating electrical energy from light received from the carrier panel;
    an energy storage device connected to the at least one photo-voltaic cell and configured for storing electrical energy generated by the photo-voltaic cell;
    at least one light source optically coupled to the carrier panel, and electrically coupled to the energy storage device, the at least one light source configured for emitting light into the carrier panel;
    at least one sensor operatively coupled to the at least one light source, the at least one light source configured for emitting light of different wavelengths in response to different readings from the at least one sensor; and the carrier panel including a plurality of luminescent domains configured for emitting luminescent light into the carrier panel upon excitation by ambient light, and for externally emitting visible luminescent light upon excitation by light from the at least one light source guided via the carrier panel;

wherein different luminescent domains of the plurality of luminescent domains comprise luminescence material configured to emit visible luminescent light upon excitation by light of different wavelengths;

wherein the at least one light source is configured for emitting light of different wavelengths for exciting respective luminescent domains to emit luminescent light;

wherein the at least one sensor includes at least one of a motion sensor, an optical sensor, a temperature sensor, a humidity sensor, a particle sensor, an Infrared (IR) sensor, a radiation sensor, and a $CO_x$ sensor; and wherein the plurality of luminescent domains comprise domains varying in a descending gradient manner from a peripheral part to a central part of the carrier panel.

2. The luminescent optical device according to claim 1, wherein the at least one light source comprises at least one of one or more controllable light emitting diodes (LEDs) and a light diffusing optical fiber surrounding the carrier panel.

3. The luminescent optical device according to claim 1, further comprising a control unit electrically connected to the at least one light source and the at least one sensor and configured for controlling the at least one light source to emit light of different wavelengths.

4. The luminescent optical device according to claim 3, wherein the control unit is a processor-controlled control unit.

5. The luminescent optical device according to claim 1, wherein the plurality of luminescent domains comprise domains of at least one of different thickness, different concentration, and different composition.

6. The luminescent optical device according to claim 1, wherein the plurality of luminescent domains comprise domains varying from at least one of higher thickness and higher concentration at the peripheral part to at least one of lower thickness and lower concentration at the central part of the carrier panel.

7. The luminescent optical device according to claim 1, wherein the plurality of luminescent domains are arranged into at least one of clusters, a matrix, and an array.

8. The luminescent optical device according to claim 7, the array including domains of pixels formed using high-resolution printing.

9. The luminescent optical device according to claim 1, the luminescent optical device configured for operating at least one of a signage, a Building-Integrated Photo-Voltaic (BIPV), an advertisement panel, a glass for automotive, and an aesthetics article.

10. The luminescent optical device according to claim 1, wherein the plurality of luminescent domains are comprised by a film by way of at least one of the film being attached to the carrier panel and the film being laminated between carrier panels.

11. The luminescent optical device according to claim 10, wherein the carrier panel comprises opposite surfaces, and wherein the film is attached to at least one of the opposite surfaces.

12. The luminescent optical device in accordance with claim 11, wherein the film is detachably attached to the carrier panel.

13. The luminescent optical device according to claim 12, wherein the film is detachably attached to the carrier panel by at least one of adhesive coupling and static electricity.

14. The luminescent optical device according to claim 10, wherein the plurality of luminescent domains are provided on the film by at least one of inkjet printing, slot-die-coating, and screen printing.

15. The luminescent optical device according to claim 1, wherein the carrier panel is a mechanically flexible panel.

16. A film comprising a plurality of luminescent domains containing luminescence material for use with the luminescent optical device according to claim 10.

17. The film according to claim 16, wherein the film is arranged into separable sections and provided on a roll.

* * * * *